United States Patent
Baluais et al.

(10) Patent No.: US 7,404,941 B2
(45) Date of Patent: Jul. 29, 2008

(54) MEDIUM PURITY METALLURGICAL SILICON AND METHOD FOR PREPARING SAME

(75) Inventors: Gerard Baluais, Chedde (FR); Yves Caratini, Chedde (FR)

(73) Assignee: Ferropem, Chambery (FR)

(*) Notice: Subject to any disclaimer, the term of this patent is extended or adjusted under 35 U.S.C. 154(b) by 797 days.

(21) Appl. No.: 10/484,316

(22) PCT Filed: Jul. 22, 2002

(86) PCT No.: PCT/FR02/02603

§ 371 (c)(1),
(2), (4) Date: Jan. 20, 2004

(87) PCT Pub. No.: WO03/010090

PCT Pub. Date: Feb. 6, 2003

(65) Prior Publication Data

US 2005/0074388 A1 Apr. 7, 2005

(30) Foreign Application Priority Data

Jul. 23, 2001 (FR) .................................. 01 09788

(51) Int. Cl.
*C01B 33/037* (2006.01)
*C01B 33/025* (2006.01)
(52) U.S. Cl. ..................... 423/349; 423/348; 423/350
(58) Field of Classification Search .............. 423/348, 423/349, 350
See application file for complete search history.

(56) References Cited

U.S. PATENT DOCUMENTS

| 4,193,975 | A | | 3/1980 | Kotval et al. |
| 4,460,556 | A | * | 7/1984 | Aulich et al. ............... 423/350 |
| 4,837,376 | A | | 6/1989 | Schwirtlich et al. |
| 5,182,091 | A | * | 1/1993 | Yuge et al. .................. 423/348 |
| 5,510,095 | A | * | 4/1996 | Aratani et al. .............. 423/348 |
| 6,090,361 | A | * | 7/2000 | Baba et al. .................. 423/350 |
| 6,391,255 | B1 | * | 5/2002 | Margaria .................... 420/578 |
| 6,632,413 | B2 | * | 10/2003 | Clark et al. ................. 423/348 |
| 2005/0227868 | A1 | * | 10/2005 | Hinman et al. ............. 502/408 |

FOREIGN PATENT DOCUMENTS

| EP | 0459421 | 12/1991 |
| EP | 0477784 | 4/1992 |
| EP | 0720967 B1 | 7/1996 |
| FR | 2585690 | 2/1987 |
| FR | 2772741 | 6/1999 |

OTHER PUBLICATIONS

Database WPI, Section Ch, Week 199234, Derwent Publications Ltd., London, Great Britain, Class E36, AN 1992-281549, Article No. XP002194088.
Search Report.

* cited by examiner

*Primary Examiner*—Ngoc-Yen M Nguyen
(74) *Attorney, Agent, or Firm*—Connolly Bove Lodge & Hutz LLP

(57) ABSTRACT

The invention concerns a method for producing a medium purity silicon comprising: preparing, by carbothermic reduction of silica in a submerged arc-furnace a silicon with low boron content; refining the liquid silicon with oxygen or chlorine; treating the refined silicon under reduced pressure from 10 to 100 Pa with neutral gas injection; segregated solidification. The invention also concerns a medium purity silicon designed to serve as raw material for making silicon of electronic or voltaic quality, and having (in weight fractions): a total of impurities ranging between 100 and 400 ppm, with the content in metallic elements ranging between 30 and 300 ppm; a boron content from 1 to 10 ppm; a phosphorus/boron ratio ranging between 0.5 and 1.5.

10 Claims, No Drawings

MEDIUM PURITY METALLURGICAL SILICON AND METHOD FOR PREPARING SAME

FIELD OF THE INVENTION

The invention relates to a medium-purity metallurgical silicon that will be used as a raw material for making electronic quality or photovoltaic quality silicon. The invention also relates to the process for making this material.

STATE OF THE ART

There are many uses of silicon and each use has its own particular specifications. For electronic and photovoltaic applications that require high degrees of purity, the method of producing finished products such as photoelectric cells or solar panels comprises a step to produce pure silicon from a basic material that is a silicon essentially with a low content of boron and phosphorus.

For a long time, declassified products derived from the production of electronic silicon have formed the main source of photovoltaic quality silicon, but this source is insufficient to supply the increasing market demand so that other silicon sources are necessary such as metallurgical silicon produced by carbothermal reduction of silica in a submerged electric arc furnace, for which the quality may be improved using various secondary metallurgy refining treatments, for example, refining with chlorine described in patent EP 0.720.967 (Pechiney Electrométallurgie). Thus, a silicon is produced satisfying specifications for example such as the following (% by weight):

iron<0.30% calcium<0.10% aluminium<0.30% boron 20 to 50 ppm phosphorus 20 to 100 ppm.

The phosphorus content is very dependent on the reduction agents used. With charcoal, it is easy to obtain silicon with a phosphorus content of about 50 ppm; this type of silicon is used particularly for making silicones. With fossil reduction agents, a silicon with a phosphorus content of less than 25 ppm can be produced, for which the main application is manufacturing of aluminium—silicon alloys. However, the purity level of these two grades is still very different from the purity level required for electronic and photovoltaic applications.

Segregated solidification has been known for a long time, and can lower the contents of many impurity elements in silicon. However, this technique is not efficient in achieving the required boron and phosphorus purity levels, starting from the two grades mentioned above.

Thus, under the pressure of the increasing market demand, a large research effort was undertaken to make a silicon with allow boron and phosphorus content starting from metallurgical silicon, particularly using purification of silicon molten under plasma.

Patent FR 2585690 by Rhône-Poulenc Spécialités Chimiques describes a two step refining process comprising plasma melting using a hydrogen—argon mix as the plasma-forming gas, followed by refining under plasma with a hydrogen—argon—oxygen mix as a gas.

Patent EP 0.459.421 (Kawasaki Steel) describes refining of silicon by plasma in a siliceous crucible, or a crucible coated with a siliceous refractory lining, using an inert gas as a plasma-forming gas to which 0.1 to 10% of water vapour is added, and optionally silica powder in a proportion less than 1 kg of silica per $Nm^3$ of gas.

CNRS Patent FR 2.772.741 describes refining of liquid silicon with a gaseous chlorine—hydrogen—water vapour mix.

These plasma treatment techniques were designed on a laboratory scale and it is difficult to transpose them to industrial scale as a result of technical difficulties encountered in making larger tools. Thus, the purpose of the invention is to obtain a medium-purity silicon with a low content of boron and phosphorus starting from metallurgical silicon while remaining within electrometallurgical techniques.

PURPOSE OF THE INVENTION

The purpose of the invention is a process for manufacturing medium purity silicon comprising:
- production of a silicon with a low content of boron, by carbothermal reduction of silica in a submerged electric arc furnace,
- refining of liquid silicon with oxygen or chlorine,
- treatment of silicon refined under low pressure from 10 to 100 Pa with injection of neutral gas,
- segregated solidification.

If necessary, this segregated solidification can be repeated after remelting, for example in an induction furnace.

This invention also relates to a medium-purity silicon to be used as a raw material for the manufacture of electronic or photovoltaic grade silicon, and with (in mass fractions):
- a total content of impurities ranging between 100 and 400 ppm, and preferably between 100 and 300 ppm, with a content of metallic elements between 30 and 300 ppm and preferably between 30 and 200 ppm,
- a boron content ranging between 1 and 10 ppm, and preferably between 1 and 3 ppm,
- and a phosphorus/boron ratio ranging between 0.5 and 1.5.

DESCRIPTION OF THE INVENTION

Normal refining techniques used in electrometallurgy are incapable of significantly reducing the boron content of silicon. This is why the applicant had the idea of making a silicon with a low boron content simply by selecting appropriate raw materials for carbothermal reduction of silica in an electric furnace.

Although this method may appear simple, it has not been used in the past because of a major difficulty; there are no known reduction agents with a low boron content and with sufficient reactivity to enable their use in an electric furnace.

For quartz, all that is necessary is to select the material based on normal criteria known to those skilled in the art, for example an $SiO_2$ content greater than 98% and the lowest possible content of alkaline elements, and also a boron content of less than 5 ppm.

The difficulty is in the selection of reduction agents. It is compulsory to select one or more reduction agents that can be used mixed together and that have a boron content of less than 2 ppm, and preferably less than 1 ppm. Many oil cokes and some pitch cokes satisfy this specification but all these products have the same problem that they are only slightly reactive in the electric furnace, and none of them enables normal operation of an electric furnace for a carbothermal reduction of silica to produce silicon.

In analysing this problem in more detail, the applicant observed that this disadvantage could be overcome provided that work is done with reduction agents with a specific area of between 20 and 40 $m^2/g$, as measured after pyrolysis at 1000° C.

The B.E.T. technique carried out on the reduction agent, at its original size grading after 24 h of drying in a drying oven at 110° C. followed by a vacuum degassing, was used exclusively to measure the specific area of reduction agents. Adsorption is done at 20° C. with dry ammonia gas; the equilibrium between the adsorbed phase and the gaseous phase is reached only slowly, each measurement being made after 24 h waiting time.

This method can be directly applied to cokes and to charcoals; prior coking at 1000° C. is essential for coal and fossil fuels. This method gives the following results:

- on charcoals: about 125 m²/g
- on the more reactive known cokes: from 80 to 140 m²/g
- on coking coals: about 80 m²/g
- on blast furnace cokes: from 40 to 50 m²/g
- on non-coking coals: from 20 to 40 m²/g
- on oil cokes: from 15 to 25 m²/g
- on pitch cokes: from 1 to 4 m²/g In a reduction furnace that is geometrically sized and electrically controlled according to conventional rules known to those skilled in the art and using reduction agents with a specific area of about 80 m²/g, manufacturing of silicon is accompanied by the formation of large quantities of fumes, of the order of 350 kg of fumes per tonne of silicon, and the formation of the order of 12 kg of silicon carbide per tonne of silicon. This production is also accompanied by the formation of about 50 kg of slag per tonne of silicon, which is usually enough to evacuate the silicon carbide formed with the pour.

The situation degrades very quickly with reduction agents with a lower specific area and therefore that are less reactive. The fume content increases to high values; the silicon carbide content also increases and since the slag produced is no longer sufficient to evacuate it, accumulation takes place in the furnace and the useful volume of the furnace is reduced, which accelerates degradation of the situation.

However, the applicant has observed that reduction agents with a lower specific area within the range of 20 to 40 m²/g could be used, provided that the normal operating parameters of the silicon furnace are modified. This modification consists of lowering the electrical power $P_e$ applied to the furnace and increasing the diameter of the electrodes $D_o$. The reaction rate imposed on the chemical system, is estimated approximately as the ratio $P_e/D_o^3$, or more precisely as one third of this ratio because three-phase furnaces have three electrodes, while its ability to follow the imposed reaction rate changes with the weighted average specific area S of the mix of reduction agents used. This weighted average area is evaluated by calculating the sum $\Sigma\ (\alpha_i S_i)$ on the n reduction agents used, where $\alpha_i$ represents the percentage of fixed carbon provided by the i(th) reduction agent used in the composition of the mix of reduction agents. Therefore the drop in S can be compensated by a drop in $P_e$ and an increase in $D_o$, while accepting a higher fumes ratio than normal, but very much less than what would have been obtained if $P_e$ and $D_o$ had been kept constant.

Whereas with normal furnace adjustment parameters, manufacturing of silicon requires an average specific area of reduction agents S>60 m²/g and a $(P_e/D_o^3)/3$ ratio equal to between 4 and 5 MW/m³, reduction agents with a specific area S of between 20 and 40 m²/g can be used provided that the $(P_e/D_o^3)/3$ ratio is between 2 and 3 MW/m³. If the carbothermal reduction of silica is done under these conditions, it is accompanied by a boron yield of between about 45 and 50%.

At this stage of the process, the analysis of the liquid silicon obtained is as follows:

Fe<0.30% Ca=0.5 to 1% Al=0.3 to 0.5%
Boron: 1 to 10 ppm Phosphorus: 10 to 25 ppm.

The relatively low content of phosphorus obtained is due to the fact that neither wood nor charcoal is used. Note also that the raw materials with low boron contents usually also have low titanium contents.

The next step consists of a refining treatment. The liquid silicon produced in the furnace is poured in ladles, where an oxidising refining is done on it by the injection of oxygen or chlorine. During this refining, the analysis of liquid silicon is as follows:

Fe<0.3% Ca<0.1% Al<0.3%
Boron: 1 to 10 ppm Phosphorus: 10 to 25 ppm

Iron and titanium contents are not much affected by this refining.

The liquid silicon ladle is then treated under low pressure with injection of a neutral gas, for example argon, at the same time; an attempt is made to keep the pressure of the liquid silicon below 100 Pa and preferably below 30 Pa. The phosphorus titre reduces in accordance with an exponential decay of the type $P = P_o\ \mathrm{Exp}\ (-kt)$. If "t" is expressed in minutes, the value of k obtained is about 0.07.

All that is necessary is to choose the treatment time as a function of the phosphorus content of the silicon to be treated. 15 minutes of treatment can be sufficient to obtain a liquid silicon titrating less than 10 ppm of phosphorus. This treatment also contributes to lowering the content of oxygen, which is partially eliminated in the form of SiO.

Other elements are only slightly affected by this treatment, which in particular is not capable of significantly lowering the content of calcium, even calcium is fairly volatile.

Finally, the last step in the process consists of solidifying silicon at a controlled rate, for example in a reverberatory furnace, so as to cause segregation of impurities that concentrate in the residual liquid. If solid and liquid are separated at about mid-solidification, the result is 48 to 52% of solid silicon with less than 500 ppm of metallic elements, and a residual liquid silicon that can contain 0.5 to 1% of metallic elements.

Cooling of the cast mass is controlled so that the front advance velocity at this stage of the process can be controlled and remains below $2 \times 10^{-5}$ m/s and preferably below $10^{-5}$ m/s.

The next step may be remelting of solid silicon with less than 500 ppm of metallic elements, by batch under a neutral atmosphere for example such as argon, in an electric furnace, and preferably an induction furnace, in a conventional hot crucible made either of carbon or graphite or silicon carbide, or with a refractory lining composed of sintered silica. The electric generator supplying electrical power to the induction furnace operates at frequencies typically between 500 and 5000 Hz, and depending on the crucible diameter. A heel is kept after each pour to facilitate restarting the next operation.

The next step is pouring into an ingot mould under a controlled inert atmosphere, in which a second segregated solidification operation is carried out; cooling of the cast mass is controlled so that the front advance velocity at this stage of the process can be controlled and remains below $10^{-5}$ m/s and preferably below $5 \times 10^{-6}$ m/s.

The degree of purity of the separated solid silicon depends on the efficiency chosen by eliminating a variable fraction of the liquid silicon depending on the holding time before the residual liquid silicon is poured.

At the end of this second segregation, a solid silicon containing less than 300 ppm of metallic impurities can be obtained representing 80 to 86% of the mass treated during this second segregation, the proportion of remaining liquid silicon enriched in metallic elements varying between 14 and 20%.

The complete system is then capable of producing about 48 to 52% of silicon containing 0.5 to 1% of metallic impurities, 7 to 10% of silicon containing 500 to 1500 ppm of metallic impurities, and 40 to 43% of medium purity silicon according to the invention.

Energy consumption is approximately 2000 kWh/t of medium purity silicon, plus about 16000 kWh/t necessary to produce the basic material, giving a total of the order of 18000 kWh/t for the medium purity silicon obtained.

The composition of the medium purity silicon obtained by this process is as follows:

Boron 1 to 10 ppm; Phosphorus/Boron ratio between 0.5 and 1.5;

Total impurities: 100 to 400 ppm;

Total metallic impurities: 30 to 300 ppm, Fe 10 to 200 ppm;

Carbon 20 to 50 ppm; Oxygen 50 to 100 ppm;

Calcium 5 to 30 ppm; Aluminium 5 to 30 ppm; Titanium 2 to 20 ppm.

The quality of the silicon obtained can be further improved by pouring more liquid during the first or the second segregation to the detriment of the efficiency, and for example obtaining a silicon with the following analysis, with a yield of 2/3 solid and 1/3 liquid:

Boron 1 to 10 ppm; Phosphorus/Boron ratio between 0.5 and 1.5;

Total impurities: 100 to 300 ppm;

Total metallic to 00 ppm, Fe 10 to 40 ppm;

Carbon 10 to 30 ppm; Oxygen 20 to 50 ppm;

Calcium 5 to 20 ppm; Aluminium 5 to 20 ppm; Titanium 2 to 10 ppm.

The complete system is then capable of separating about 48 to 52% of silicon containing 0.5 to 1% of metallic impurities, 16 to 18% of silicon containing 500 to 1500 ppm of metallic impurities, and 32 to 34% silicon according to the invention, on a carbothermal silicon production.

EXAMPLES

Example 1

Several silica reduction tests have been carried out on a 100 kW furnace using a carbothermal reaction, and operating in DC at 5 kA, with a pre-baked carbon electrode with a diameter of 350 mm, and a calculated power density (equal to $/1;3P_e/D_o^3$) of 2.3 MW/m$^3$.

A test with pitch coke with size grading between 2 and 7 mm and with large macroporosities visible to the naked eye, and giving a specific area of 2 m$^2$/g after use of the BET method with ammonia, was catastrophic with the furnace being blocked in less than 48 h by accumulation of solid SiC.

A series of tests was carried out with different oil cokes, and it was determined that the reactivity threshold necessary to keep the furnace operating continuously is about 20 m$^2$/g.

Example 2

The remaining tests were carried out on a 100 kW three-phase furnace equipped with 250 mm diameter pre-baked electrodes.

Analyses of low content elements were made by ICP (Inductively Coupled Plasma).

The furnace load was composed of:

a quartz batch for which the boron content was 3 ppm, oil coke with a size grading of 6 to 12 mm and a specific area of 27 m$^2$/g, in which the boron content is less than the minimum detectable level (0.5 ppm).

Adjusted with $C_3=I/P_e^{2/3}$ of 9.5 (I is the intensity in the electrodes in kA, $C_3$ is the furnace adjustment constant), this furnace usually has a thermal efficiency of 45% compared with 75 to 85% for an industrial furnace within the 10 MW to 20 MW range.

The results were as follows:

Energy: 29300 kWh/t, which would give 16470 kWh/t for a thermal efficiency of 80%.

Silica consumption: 3680 kg/t.

Analysis of silicon on the gross furnace production.

Boron=5 ppm Phosphorus=18 ppm.

Considering the fact that the furnace is so small, production was poured into ingot moulds and was retrieved in the solid state. This production was collected and then remelted in an 800 kW induction furnace in which an oxidising refining was carried out on it by injection of oxygen using a graphite rod, which made it possible to obtain the following composition:

Fe<0.24% Ca<0.09% Al<0.12% Ni=38 ppm

Total metallic impurities<0.50%

Boron=5 ppm

Phosphorus=18 ppm.

The contents of the induction furnace were then poured into a ladle preheated using a gas burner. 275 kg were thus poured in this ladle, that was then placed under a bell housing for a vacuum treatment with simultaneous injection of argon through the bottom through a porous brick. The treatment duration was 14 minutes; the gas pressure above the molten metal was measured at 30 Pa.

The phosphorus content after treatment was measured at 7 ppm.

The ladle contents were then poured into a sintered silica ingot mould provided with a pouring spout. This ingot mould with an area of 1 m$^2$ was placed in a reverberatory furnace electrically heated using graphite bars acting as resistances, heat losses from the furnace taking place mainly through the hearth. The furnace power was adjusted to 40 kW so that about 50% of the silicon was solidified in the ingot mould in about 1.25 h. After 75 minutes waiting, the liquid remaining in the ingot mould was poured through the spout and produced a 137 kg ingot.

The mass of the solid silicon remaining in the ingot mould was 135 kg and the result of the analysis was:

Iron=300 ppm; Calcium=25 ppm; Aluminium=12 ppm; Titanium=6 ppm; Boron=5 ppm; Phosphorus=7 ppm; Carbon=100 ppm; Oxygen=800 ppm.

The operation was repeated to obtain a sufficient quantity of silicon so that a complete remelting and segregated solidification could be carried out in the 800 kW furnace. The furnace power was held at 50 kW. The residual liquid pour was made after 4 hours of waiting. The poured mass resulted in a 85 kg ingot, whereas the solidified silicon mass recovered was 183 kg.

The solid silicon obtained after this second segregated solidification operation resulted in the following analysis:

Iron=35 ppm; Calcium=17 ppm; Aluminium=14 ppm; Titanium=4 ppm; Boron=5 ppm; Phosphorus=7 ppm; Carbon=25 ppm; Oxygen=100 ppm.

The invention claimed is:

1. A process for making medium-purity silicon, as a raw material for making photovoltaic quality or electronic quality silicon, the process comprising:

producing a liquid silicon with a low content of boron, by carbothermal reduction of silica in a submerged electric arc furnace, wherein a power density used expressed as a $(P_e/D_o^3)/3$ ratio is between 2 and 3 MW/m$^3$, and a weighted average specific area S of reduction agents used is between 20 and 40 m$^2$/g;

refining the liquid silicon with oxygen or chlorine;
treating the refined liquid silicon under low pressure between 10 and 100 Pa with injection of neutral gas; and
solidifying the treated liquid silicon by segregated solidification.

2. The process according to claim 1, wherein the segregated solidification is followed by remelting of the solid obtained and then solidifying and remelting steps are repeated.

3. The process according to claim 1, wherein the segregated solidification is carried out at a solidification front advance velocity below $2 \times 10^{-5}$ m/s.

4. The process according to claim 2, wherein a second segregated solidification is carried out at a solidification front advance velocity below $10^{-5}$ m/s.

5. The process according to claim 4, wherein the solidification front advance velocity is below $5 \times 10^{-6}$ m/s.

6. The process according to claim 1 wherein the segregated solidification is carried out in a reverberatory furnace.

7. The process according to claim 2, wherein the remelting is carried out in an electric furnace.

8. The process according to claim 2, wherein an electric furnace is used for the remelting and the electric furnace comprises a crucible made of silica, carbon, graphite, or silicon carbide.

9. The process according to claim 2, wherein the first segregated solidification is carried out at a solidification front advance velocity below $2 \times 10^{-5}$ m/s.

10. The process according to claim 7, wherein the electric furnace used for silicon remelting comprises a crucible made of silica, carbon, graphite, or silicon carbide.

* * * * *